(12) United States Patent
Uenoyama et al.

(10) Patent No.: US 12,099,296 B2
(45) Date of Patent: Sep. 24, 2024

(54) METHOD FOR PRODUCING OPTICAL ELEMENT AND OPTICAL ELEMENT

(71) Applicant: HAMAMATSU PHOTONICS K.K., Hamamatsu (JP)

(72) Inventors: Soh Uenoyama, Hamamatsu (JP); Hiroki Kamei, Hamamatsu (JP); Kazuyoshi Hirose, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/226,721

(22) Filed: Apr. 9, 2021

(65) Prior Publication Data

US 2021/0318611 A1 Oct. 14, 2021

(30) Foreign Application Priority Data

Apr. 13, 2020 (JP) ................. 2020-071534

(51) Int. Cl.
*G03F 7/00* (2006.01)
*G02B 27/00* (2006.01)

(52) U.S. Cl.
CPC ....... *G03F 7/0005* (2013.01); *G02B 27/0012* (2013.01)

(58) Field of Classification Search
CPC .............. G03F 7/0005; G02B 1/002
See application file for complete search history.

(56) References Cited

U.S. PATENT DOCUMENTS

| | | | | |
|---|---|---|---|---|
| 2008/0248267 | A1* | 10/2008 | Taylor | G03F 7/0005 430/296 |
| 2017/0261368 | A1* | 9/2017 | Nam | H01L 27/14603 |
| 2018/0341090 | A1* | 11/2018 | Devlin | G03F 7/40 |

FOREIGN PATENT DOCUMENTS

| | | |
|---|---|---|
| JP | 2000-227511 A | 8/2000 |
| JP | 2008-516263 A | 5/2008 |
| JP | 2009-031538 A | 2/2009 |
| JP | 2014-194553 A | 10/2014 |
| JP | 2018-536204 A | 12/2018 |
| WO | WO-2005/121842 A1 | 12/2005 |
| WO | WO-2015/068802 A1 | 5/2015 |
| WO | WO-2017/091738 A1 | 6/2017 |

\* cited by examiner

*Primary Examiner* — Alex A Rolland
(74) *Attorney, Agent, or Firm* — Faegre Drinker Biddle & Reath LLP

(57) ABSTRACT

A method for producing an optical element includes: forming a resist layer on a main surface of a substrate; forming a pattern region in the resist layer; forming a groove; forming a dielectric layer covering the pattern region; and forming an optical functional portion. The pattern region is formed in the resist layer. The groove is formed in a portion corresponding to a periphery of the pattern region as viewed in a direction orthogonal to the main surface. A dielectric is deposited to form the dielectric layer. After the dielectric layer covering the pattern region is formed, the resist layer is removed to form the optical functional portion at a position where the pattern region is disposed on the main surface. The optical functional portion is made of the dielectric.

11 Claims, 11 Drawing Sheets

METHOD FOR PRODUCING OPTICAL ELEMENT AND OPTICAL ELEMENT

TECHNICAL FIELD

The present invention relates to a method for producing an optical element and an optical element.

BACKGROUND

A known optical element includes a substrate and an optical functional portion provided on a main surface of the substrate. For example, in Japanese Unexamined Patent Publication No. 2018-536204, the optical functional portion is made of a dielectric.

SUMMARY

Japanese Unexamined Patent Publication No. 2018-536204 describes that in the formation of the optical functional portion, a resist layer is formed on the main surface of the substrate, a region in which a predetermined pattern is provided is formed in the resist layer, and the dielectric is deposited in the pattern region. The optical functional portion having a desired structure is formed on the main surface of the substrate by the deposition of the dielectric in the pattern region.

The inventors of the present application have faced a problem that when the dielectric is deposited, the resist layer cracks and the structure of the pattern region collapses. When the structure of the pattern region collapses, the optical functional portion having a desired structure is not formed. For this reason, it is desired that the collapse of the structure in the pattern region is suppressed. When the collapse of the structure is suppressed, the optical element provided with the optical functional portion having a desired structure can be realized.

An object of one aspect of the present invention is to provide a method for producing an optical element provided with an optical functional portion having a desired structure. An object of another aspect of the present invention is to provide an optical element provided with an optical functional portion having a desired structure.

According to one aspect of the present invention, there is provided a method for producing an optical element, the method including: forming a resist layer on a main surface of a substrate; forming a pattern region in the resist layer; forming a groove; forming a dielectric layer covering the pattern region; and forming an optical functional portion. A pattern penetrating through the resist layer is provided in the pattern region. The groove is formed in a portion corresponding to a periphery of the pattern region as viewed in a direction orthogonal to the main surface. A dielectric is deposited in a state where the resist layer is provided on the main surface, to form the dielectric layer. After the dielectric layer covering the pattern region is formed, the resist layer is removed to form the optical functional portion at a position where the pattern region was disposed on the main surface. The optical functional portion is made of the dielectric.

In the one aspect, the groove is formed in the portion corresponding to the periphery of the pattern region. As a result of diligent research, the inventors of the present application have found that in the production method, a crack is suppressed from being generated in the pattern region when the dielectric is deposited. If the generation of the crack in the pattern region is suppressed, by removal of the resist layer after formation of the dielectric layer, an optical functional portion having a desired structure can be realized.

In the one aspect, the production method may further include depositing the dielectric in a state where the resist layer is provided on the main surface, to form a dielectric layer covering the groove; and forming a wall portion made of the dielectric. The resist layer may be removed after the dielectric layer covering the groove is formed, thereby the wall portion is formed at a position where the groove was disposed on the main surface. In this case, a crack is suppressed from reaching the pattern region.

In the one aspect, the groove may be formed in the resist layer to completely surround the pattern region as viewed in the direction orthogonal to the main surface. In this case, the generation of a crack in the pattern region is more reliably suppressed.

In the one aspect, the groove may be formed to surround the pattern region as viewed in the direction orthogonal to the main surface, so that an internal region including the pattern region is defined. As viewed in the direction orthogonal to the main surface, an area of a portion obtained by removing the pattern region from the internal region may be smaller than an area of a portion obtained by removing the internal region from a portion in which the resist layer is provided. In this case, the generation of a crack in the pattern region is more reliably suppressed.

In the one aspect, the optical functional portion may include a plurality of structural bodies. Each of the structural bodies may be formed such that the maximum length of each of the structural bodies in a direction along the main surface is 200 nm or less.

In the one aspect, a plurality of the pattern regions separated from each other may be formed in the resist layer. The groove may be formed in the portion corresponding to the periphery of each of the pattern regions as viewed in the direction orthogonal to the main surface. The dielectric layer may be formed to cover each of the pattern regions. The optical functional portion may be formed at the position where each of the pattern regions was disposed. In this case, a plurality of the optical functional portions are formed at once, and further the generation of a crack in each of the pattern regions is suppressed.

According to another aspect of the present invention, there is provided an optical element including: a substrate; an optical functional portion; and a wall portion. The substrate has a main surface. The optical functional portion is provided on the main surface of the substrate and is made of a dielectric. The wall portion is provided on a periphery of the optical functional portion on the main surface of the substrate as viewed in a direction orthogonal to the main surface.

In the aspect, the wall portion is provided on the periphery of the optical functional portion. With the configuration where the wall portion is formed on the periphery of the optical functional portion, an optical functional portion having a desired structure can be easily realized.

In the aspect, the wall portion may completely surround the optical functional portion as viewed in the direction orthogonal to the main surface. In this case, an optical functional portion having a desired structure can be realized more easily and reliably.

In the aspect, the main surface may include an optical region in which the optical functional portion is provided. The wall portion may define an internal region including the optical region as viewed in the direction orthogonal to the main surface. As viewed in the direction orthogonal to the main surface, an area of a portion obtained by removing the optical region from the internal region may be smaller than an area of a portion obtained by removing the internal region from the main surface. In this case, an optical functional portion having a desired structure can be more reliably realized.

In the aspect, the optical functional portion may include a plurality of structural bodies. The maximum length of each of the structural bodies in a direction along the main surface may be 200 nm or less.

In the aspect, on the main surface of the substrate, the optical functional portion may be provided in each of optical regions separated from each other. The wall portion may be provided on a periphery of each of the optical regions as viewed in the direction orthogonal to the main surface. In this case, an optical element provided with a plurality of the optical functional portions having a desired structure can be easily realized.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION

Hereinafter, an embodiment of the present invention will be described in detail with reference to the accompanying drawings. Incidentally, in the description, the same components or components having the same function are denoted by the same reference signs, and duplicated description will be omitted.

Figure 1:
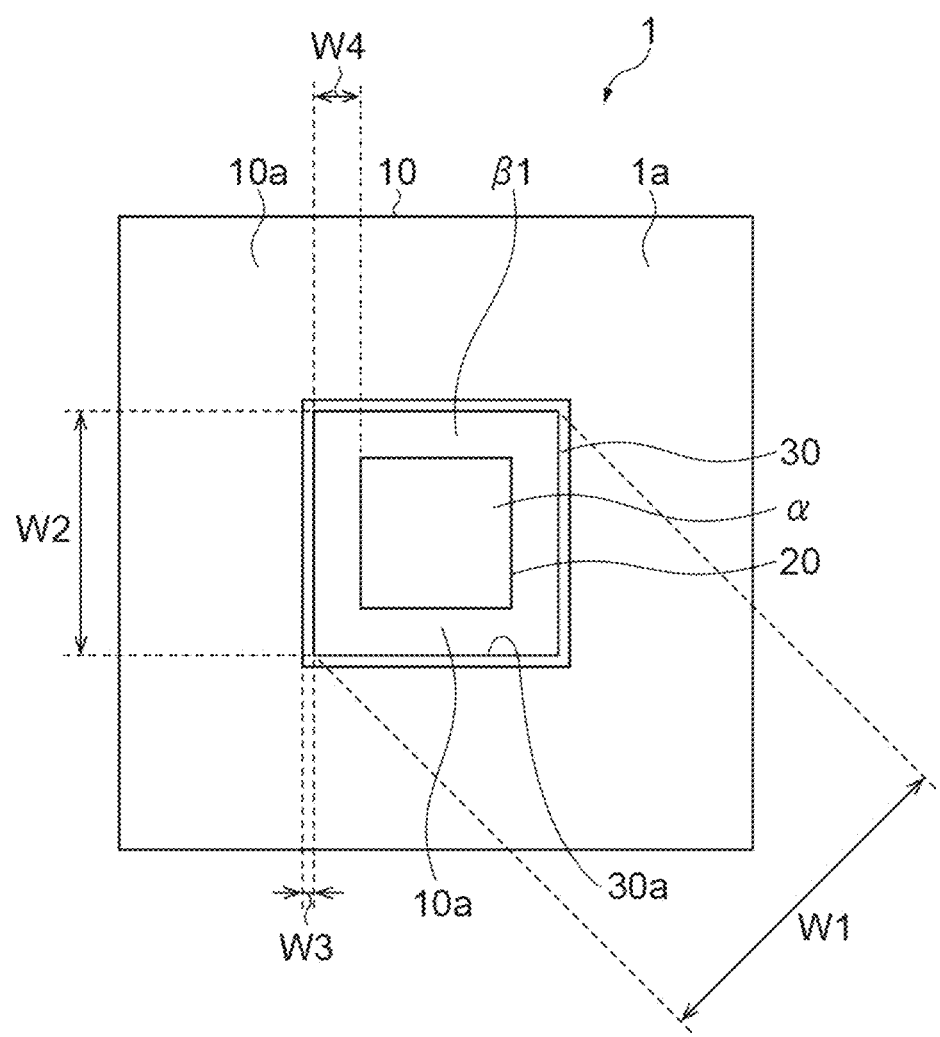
FIG. 1 is a schematic plan view of an optical element in the present embodiment.
Figure 2:
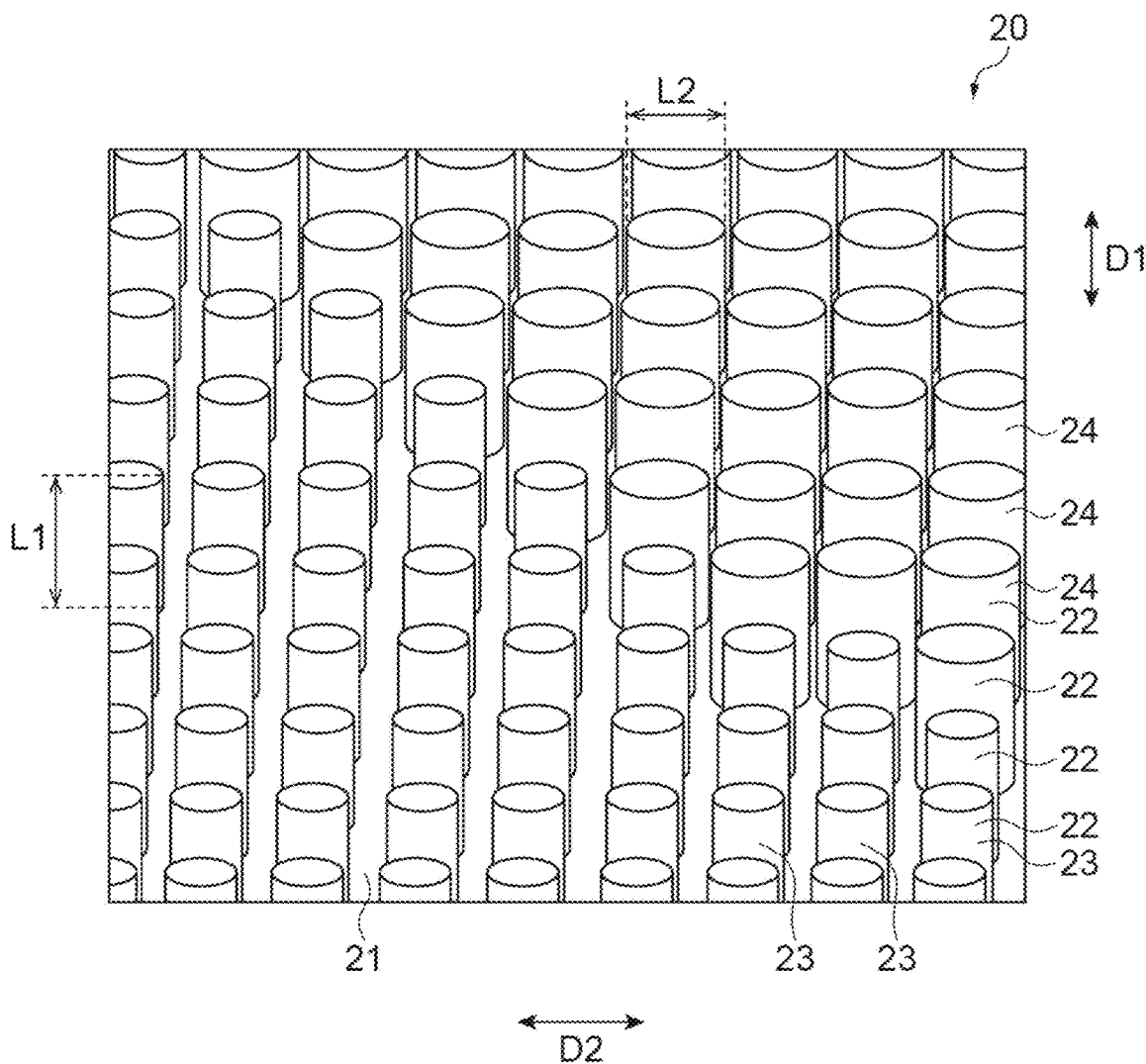
FIG. 2 is an enlarged perspective view of the optical element.

First, a configuration of an optical element in the present embodiment will be described with reference to FIGS. 1 to 3. FIG. 1 is a schematic plan view of the optical element in the present embodiment. An optical element 1 has a surface 1a on which an electromagnetic wave is incident. The optical element 1 produces a desired optical action on the incident electromagnetic wave. For example, the optical element 1 has a desired optical performance for the incident electromagnetic wave in terms of transmittance, reflectivity, refractive index, and the like. For example, the optical element 1 is configured to have a desired optical performance for an electromagnetic wave having a wavelength of 200 nm to 2,000 nm. The optical element 1 is, for example, a lens having a focal length of 500 μm for an electromagnetic wave having a wavelength of 266 nm.

The optical element 1 includes a substrate 10, an optical functional portion 20, and a wall portion 30. The optical element 1 includes the optical functional portion 20 in a portion on which the above electromagnetic wave is to be incident on the surface 1a. The optical element 1 produces the above desired optical action on the incident electromagnetic wave in at least the portion in which the optical functional portion 20 is provided. FIG. 2 is an enlarged perspective view of the portion of the optical element 1, in which the optical functional portion 20 is provided. FIG. 3 is an enlarged cross-sectional view of the portion of the optical element 1, in which the optical functional portion 20 is provided.

The substrate 10 has a main surface 10a. The main surface 10a of the substrate 10 includes an optical region α in which the optical functional portion 20 is provided. In the present embodiment, the substrate 10 has transparency for the above electromagnetic wave to be incident on the optical element 1. For example, the substrate 10 has transparency for an electromagnetic wave having a wavelength of 200 nm to 2,000 nm. In the present specification, "having transparency" refers to having a light transmittance of at least approximately 80%. The substrate 10 includes, for example, quartz as a material. For example, the substrate 10 includes quartz glass. The main surface 10a is a flat surface. The maximum width of the main surface 10a is, for example, 10 mm or more. In the present embodiment, the main surface 10a has, for example, a rectangular shape with one side of 10 mm or more.

The optical functional portion 20 has an artificial microstructure. The optical functional portion 20 forms a dielectric metasurface. The optical functional portion 20 optically acts on the incident electromagnetic wave due to the structure of the optical functional portion 20. The optical functional portion 20 is provided on the main surface 10a. "Being provided on the main surface" includes not only the case of being in contact with the main surface, but also the case of being provided on the main surface with another member interposed therebetween.

The optical functional portion 20 is made of a dielectric. The optical functional portion 20 includes a plurality of structural bodies 22. In the present embodiment, as illustrated in FIG. 1, the optical functional portion 20 is provided in the optical region α having a rectangular shape on the main surface 10a of the substrate 10. In the present embodiment, the optical element 1 has one optical region α. The optical region α is a region in which the plurality of structural bodies 22 are disposed as viewed in a direction D1 orthogonal to the main surface 10a. The optical region α is, for example, a 320 μm square.

The plurality of structural bodies 22 are made of a dielectric. The plurality of structural bodies 22 are disposed on the main surface 10a. The plurality of structural bodies 22 are two-dimensionally arranged on the main surface 10a of the substrate 10. In the present embodiment, the plurality of structural bodies 22 are disposed in the optical region α described above as viewed in the direction D1 orthogonal to the main surface 10a.

The optical functional portion 20 produces various optical actions on the incident electromagnetic wave according to the structure of the plurality of structural bodies 22. In other words, the plurality of structural bodies 22 are configured to produce a desired optical action on the incident electromagnetic wave. The plurality of structural bodies 22 include, for example, at least one of hafnium dioxide, titanium dioxide, silicon dioxide, silicon nitride, silicon, and gallium arsenide.

Each of the structural bodies 22 extends in the direction D1 intersecting the main surface 10a of the substrate 10. In the present embodiment, the direction D1 is orthogonal to the main surface 10a. Each of the structural bodies 22 has, for example, a column shape. As illustrated in FIG. 2, each of the structural bodies 22 has, for example, a circular column shape. In the present embodiment, each of the structural bodies 22 stands upright with respect to the main surface 10a. The plurality of structural bodies 22 may include structural bodies 23 and 24 having shapes different from each other. A direction D2 intersects the direction D1. The direction D2 is along the main surface 10a of the substrate 10. In the present embodiment, the direction D2 is parallel to the main surface 10a, and is orthogonal to the direction D1. When the direction D1 is a first direction, the direction D2 is a second direction.

A maximum length L1 of each of the structural bodies 22 in the direction D1 is, for example, from 1 nm to 2,000 nm. A maximum length L2 of each of the structural bodies 22 in the direction D2 along the main surface 10a is, for example, 200 nm or less. The maximum length L2 is, for example, from 1 nm to 200 nm. When the maximum length L2 is, for example, from 30 nm to 200 nm, the formation of each of the structural bodies 22 is more easily realized. The ratio of the maximum length L2 of each of the structural bodies 22 in the direction D2 to the maximum length L1 of the structural body 22 in the direction D1 is, for example, from 0.06 to 0.40. In the present embodiment, it is assumed that an electromagnetic wave having a wavelength of 266 nm is incident on the optical element 1. The maximum length L1 is 500 nm, the maximum length L2 of each of the structural bodies 23 and 24 is from 80 nm to 120 nm, and the interval between the plurality of structural bodies 22 is 160 nm. The interval between the plurality of structural bodies 22 means the interval between the geometric centers of the structural bodies 22 as viewed in the direction D1.

The structural body 23 and the structural body 24 have, for example, a circular column shape. The structural body 23 and the structural body 24 are different from each other, for example, in terms of the maximum length L2 in the direction D2 along the main surface 10a. The maximum length L2 of each of the structural bodies 23 and 24 in the direction D2 is the diameter of a bottom surface. When the bottom surfaces of the structural bodies 23 and 24 have an elliptical shape, the direction D2 is a minor axis direction. When the bottom surfaces of the structural bodies 23 and 24 have a rectangular shape, the direction D2 is a short side direction. When the bottom surfaces of the structural bodies 23 and 24 have an elongated shape, the direction D2 is a direction orthogonal to an elongated direction.

Figure 3:
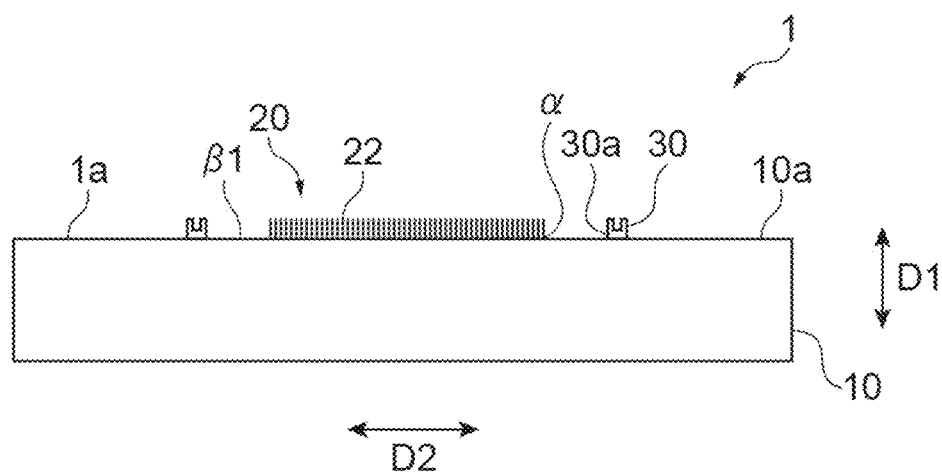
FIG. 3 is an enlarged cross-sectional view of the optical element.

As illustrated in FIG. 3, the wall portion 30 is provided on the main surface 10a of the substrate 10. The wall portion 30 is provided on the periphery of the optical region α as viewed in the direction D1. The wall portion 30 is provided on the periphery of the optical functional portion 20 as viewed in the direction D1. In the present embodiment, the wall portion 30 surrounds one optical region α in which the optical functional portion 20 is provided, as viewed in the direction D1. The wall portion 30 has a ring shape. The wall portion 30 has a ring shape as viewed in the direction D1. The wall portion 30 is disposed along the edge of the optical region α. As a modification example of the present embodiment, the optical element 1 may have a plurality of the optical regions α separated from each other. The wall portion 30 may collectively surround the plurality of optical regions α separated from each other. In other words, the wall portion 30 may not be located between the optical regions α adjacent to each other.

In the present embodiment, as illustrated in FIG. 1, the wall portion 30 completely surrounds the optical functional portion 20 as viewed in the direction D1. In other words, the wall portion 30 is formed in a continuous ring shape. As a modification example of the present embodiment, the wall portion 30 may intermittently surround the optical functional portion 20 as viewed in the direction D1. In other words, the wall portion 30 may be formed in a ring shape that is at least partially discontinuous. In further other words, the wall portion 30 may be formed of a plurality of members separated from each other, and the plurality of members may surround one optical region α.

The wall portion 30 defines an internal region β1 as viewed in the direction D1. In other words, the internal region β1 is surrounded by the wall portion 30. The optical region α is included in the internal region β1. The optical functional portion 20 is provided in the internal region β1. As viewed in the direction D1, the area of a portion obtained by removing the optical region α from the internal region β1 is smaller than the area of a portion obtained by removing the internal region β1 from the main surface 10a. In the present embodiment, the area of the internal region β1 is smaller than the area of the portion obtained by removing the internal region β1 from the main surface 10a. In the present embodiment, the wall portion 30 has a rectangular ring shape, and the internal region β1 has a rectangular shape.

In the present embodiment, a maximum width W1 of an outer edge 30a of the internal region β1 is approximately 650 μm as viewed in the direction D1. A length W2 of one side of the outer edge 30a of the internal region β1 in the direction D2 is approximately 460 μm as viewed in the direction D1. A width W3 of the wall portion 30 in the direction D2 is approximately 20 μm. A shortest distance W4 between the wall portion 30 and the optical region α is approximately 70 μm.

Figure 4:
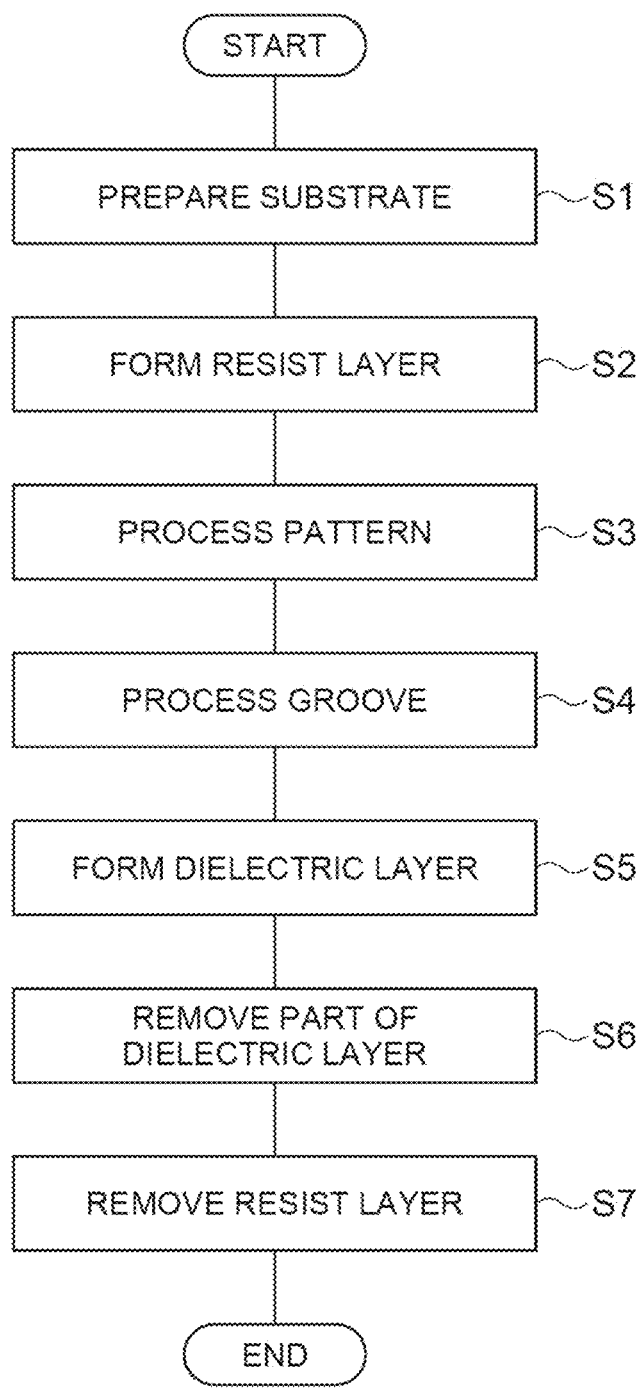
FIG. 4 is a flowchart illustrating a method for producing an optical element.

Next, a method for producing the optical element 1 will be described with reference to FIG. 4, FIGS. 5A to 5E, and FIGS. 6 and 3. FIG. 4 is a flowchart illustrating the method for producing an optical element. FIGS. 5A to 5E and 6 are views for describing the method for producing an optical element.

Figure 5A:
FIG. 5A is a view for describing the method for producing an optical element.

First, the substrate 10 is prepared (process S1). The substrate 10 has the main surface 10a as illustrated in FIG. 5A. The direction D1 is a direction orthogonal to the main surface 10a, and the direction D2 is a direction along the main surface 10a. The substrate 10 has transparency for the above electromagnetic wave to be incident on the optical element 1. The substrate 10 is made of, for example, quartz. For example, the substrate 10 includes quartz glass.

Figure 5B:
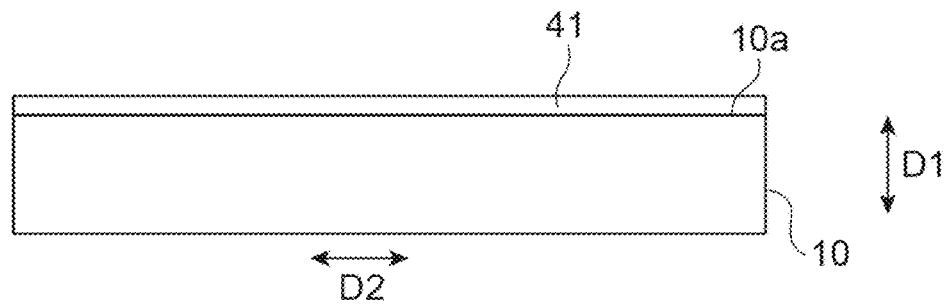
FIG. 5B is a view for describing the method for producing an optical element.

Next, a resist layer 41 is formed on the main surface 10a of the substrate 10 (process S2). In process S2, as illustrated in FIG. 5B, the resist layer 41 is formed on the main surface 10a as one continuous layer. In process S2, the resist layer 41 has a first surface 41a facing the main surface 10a, and a second surface 41b located on a side opposite the first surface 41a. The thickness of the resist layer 41 is determined according to the maximum length L1 of each of the structural bodies 22 to be formed. For example, the thickness of the resist layer 41 is the same as the maximum length L1 of each of the structural bodies 22. "The same" includes a range of production tolerance. The resist layer 41 is made of, for example, an electron beam resist. The resist layer 41 may be made of a photoresist. In process S2, the resist layer 41 is formed, for example, by applying the resist on the main surface 10a using spin coating. Another layer may be formed between the main surface 10a and the resist layer 41.

Figure 5C:
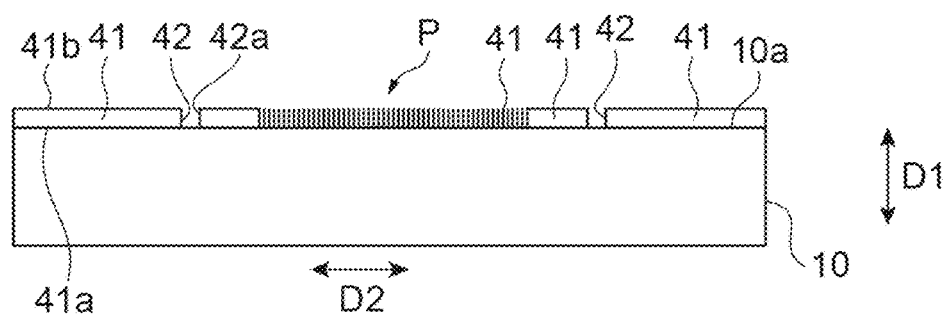
FIG. 5C is a view for describing the method for producing an optical element.
Figure 6:
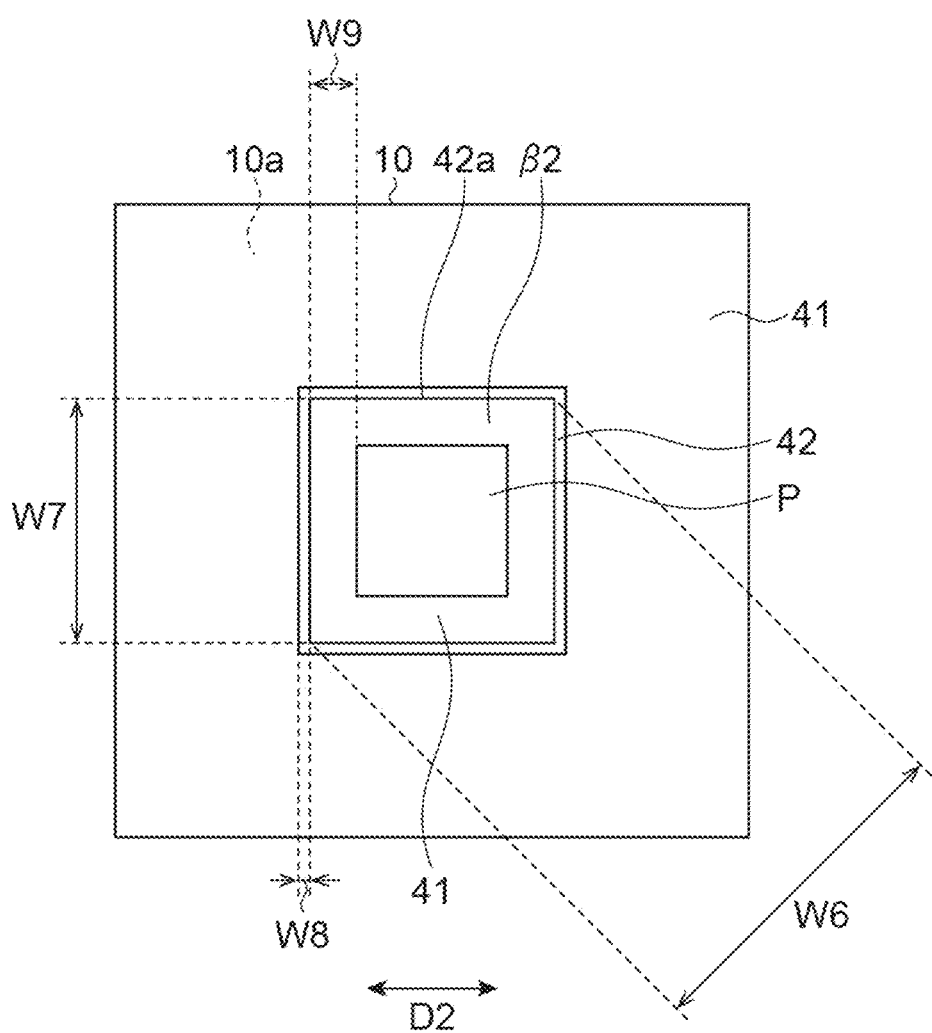
FIG. 6 is a view for describing the method for producing an optical element.

Next, the resist layer 41 is processed such that a pattern region P is formed (process S3). The pattern region P is a region on which patterning is performed. In the patterning of process S3, as illustrated in FIGS. 5C and 6, the resist layer 41 is processed such that a pattern penetrating through the resist layer 41 from the second surface 41b to the first surface 41a is formed. The pattern region P in which the above pattern is provided is formed in the resist layer 41 by the processing. In the present embodiment, the main surface 10a of the substrate 10 is exposed from the pattern of the pattern region P. When another layer is formed between the main surface 10a and the resist layer 41, the another layer is exposed in the pattern of the pattern region P. The pattern of the pattern region P is determined according to each of the structural bodies 22 to be formed. In the present embodiment, the pattern region P has a rectangular shape.

Next, the resist layer 41 is processed such that a groove 42 is formed (process S4). As illustrated in FIGS. 5C and 6, the groove 42 is formed in a portion of the resist layer 41, the portion corresponding to the periphery of the pattern region P as viewed in the direction D1. The groove 42 is formed to penetrate through the resist layer 41 from the second surface 41b to the first surface 41a. The main surface 10a of the substrate 10 is exposed in the groove 42. In the present embodiment, the groove 42 is formed to surround one pattern region P as viewed in the direction D1. The groove 42 has a ring shape.

In the present embodiment, the groove 42 is formed in the resist layer 41 to completely surround the pattern region P as viewed in the direction D1. In other words, the groove 42 is formed in a continuous ring shape. As a modification example of the present embodiment, the groove 42 may be formed in the resist layer 41 to intermittently surround the pattern region P as viewed in the direction D1. In other words, the groove 42 may be formed in a ring shape that is at least partly discontinuous. In further other words, the groove 42 may be formed of a plurality of members separated from each other, and the plurality of members may be formed to surround one pattern region P. In this case, the time required to process the resist layer 41 is reduced.

In process S4, the groove 42 defines an internal region β2 as viewed in the direction D1. In other words, the internal region β2 is surrounded by the groove 42. The pattern region P is included in the internal region β2. As viewed in the direction D1, the area of a portion obtained by removing the pattern region P from the internal region β2 is smaller than the area of a portion obtained by removing the internal region β2 from a portion in which the resist layer 41 is provided. In the present embodiment, the area of the internal region β2 is smaller than the area of the portion obtained by removing the internal region β2 from the portion in which the resist layer 41 is provided. In the present embodiment, the groove 42 has a rectangular ring shape, and the internal region β2 has a rectangular shape.

In the present embodiment, a maximum width W6 of an outer edge 42a of the internal region β2 is approximately 650 μm as viewed in the direction D1. A length W7 of one side of the outer edge 42a of the internal region β2 in the direction D2 is approximately 460 μm as viewed in the direction D1. A width W8 of the groove 42 in the direction D2 is approximately 20 μm. A shortest distance W9 between the groove 42 and the pattern region P is approximately 70 μm.

In process S3 and process S4, the resist layer 41 is processed, for example, by exposure and development by electron beam lithography. When the resist layer 41 is formed of a photoresist, the resist layer 41 is processed by exposure and development by photolithography. As a modification example of the present embodiment, process S4 may be performed before process S3, or may be performed at the same time as process S3.

Next, a dielectric 50 is deposited in a state where the resist layer 41 processed in process S3 and process S4 is provided on the main surface 10a, to form a dielectric layer 51 (process S5). The dielectric 50 is deposited on the resist layer 41 and the main surface 10a exposed from the resist layer 41. The dielectric layer 51 covers the pattern region P and the groove 42. The length of the dielectric layer 51 which is formed on the main surface 10a exposed from the resist layer 41 is longer than the length of the resist layer 41 in the direction D1. In other words, the dielectric 50 is deposited to be thicker on the main surface 10a exposed from the resist layer 41 than the thickness of the resist layer 41 in the direction D1.

Figure 5D:
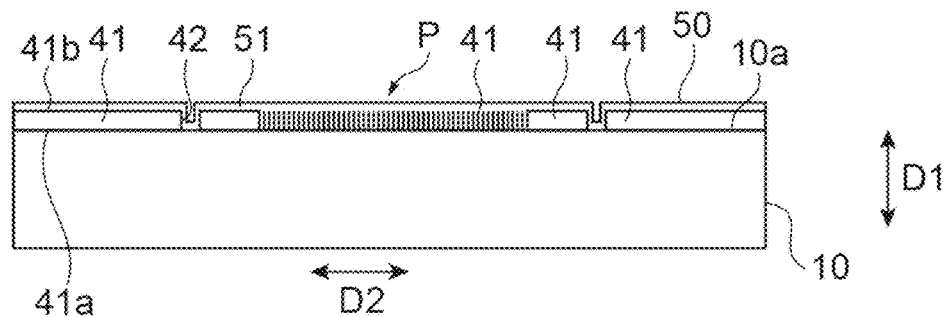
FIG. 5D is a view for describing the method for producing an optical element.

The dielectric 50 is deposited from a side in contact with the main surface 10a of the substrate 10, for example, by vapor thin film deposition. For example, atomic layer deposition (ALD) is used as the vapor thin film deposition. For example, chemical vapor deposition (CVD) is used as the vapor thin film deposition. In the present embodiment, as illustrated in FIG. 5D, the dielectric 50 is laminated on the pattern region P and the groove 42 from the side, which is in contact with the main surface 10a, by the atomic layer deposition. In process S5, the dielectric 50 is laminated until at least the resist layer 41 and the main surface 10a exposed from the resist layer 41 are not visible. The process of laminating the dielectric 50 is continued to form the dielectric layer 51. The dielectric 50 includes, for example, at least one of hafnium dioxide, titanium dioxide, silicon dioxide, silicon nitride, silicon, and gallium arsenide. In the present embodiment, the dielectric layer 51 is laminated on the pattern region P and the groove 42 at a film deposition temperature of approximately 170° C.

Figure 5E:
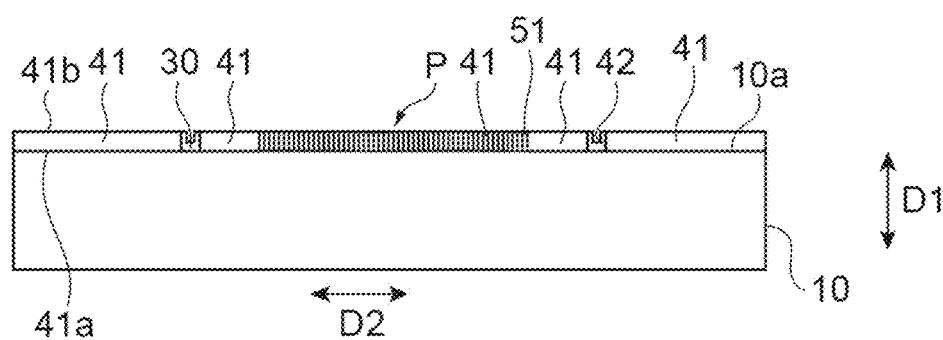
FIG. 5E is a view for describing the method for producing an optical element.

Next, a part of the dielectric layer 51 is removed (process S6). As illustrated in FIG. 5E, a part of the dielectric layer 51 is removed such that the second surface 41b of the resist layer 41 and the dielectric layer 51 are flush with each other. When an unnecessary portion of the dielectric layer 51 is removed in such a manner, the dielectric layer 51 remains only on a portion where the resist layer 41 is not provided on the main surface 10a, as viewed in the direction D1 orthogonal to the main surface 10a of the substrate 10. In process S6, the dielectric layer 51 is removed, for example, by etching. For example, dry etching is used as the etching. For example, reactive ion etching (RIE) is used as the dry etching. For example, an inductively coupled plasma is used in the reactive ion etching.

Next, the resist layer 41 is removed (process S7). As illustrated in FIG. 3, the resist layer 41 disposed on the main surface 10a of the substrate 10 is completely removed. In process S7, the resist layer 41 is removed, for example, by a resist stripping process (ashing). For example, oxygen plasma ashing is used as the resist stripping process.

In process S7, by the removal of the resist layer 41, the plurality of structural bodies 22 made of the dielectric 50 and the wall portion 30 made of the dielectric 50 are formed on the main surface 10a. The optical functional portion 20 is formed by the plurality of structural bodies 22. As described above, by the removal of the resist layer 41, the optical functional portion 20 made of the dielectric 50 is formed on the main surface 10a. The optical functional portion 20 is formed at a position where the pattern region P was disposed. The wall portion 30 is formed at a position where the groove 42 was disposed. The internal region β2 corresponds to the internal region β1.

Figure 7:
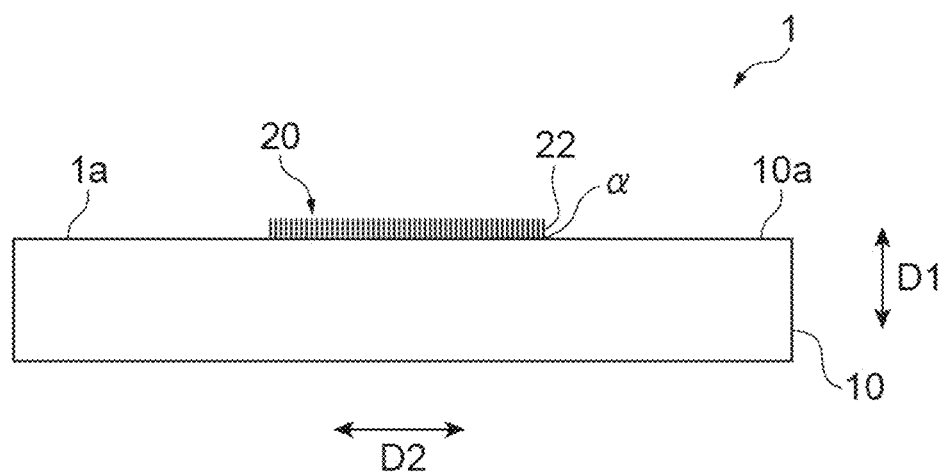
FIG. 7 is a view for describing a method for producing an optical element in a modification example of the present embodiment.

As a modification example of the present embodiment, as illustrated in FIG. 7, the wall portion 30 may be removed after process S7. The wall portion 30 may be removed, for example, by a chemical solution. The wall portion 30 may be removed when the substrate 10 is cut by dicing. The production throughput is higher in a configuration where the wall portion 30 is remained.

Figure 8:
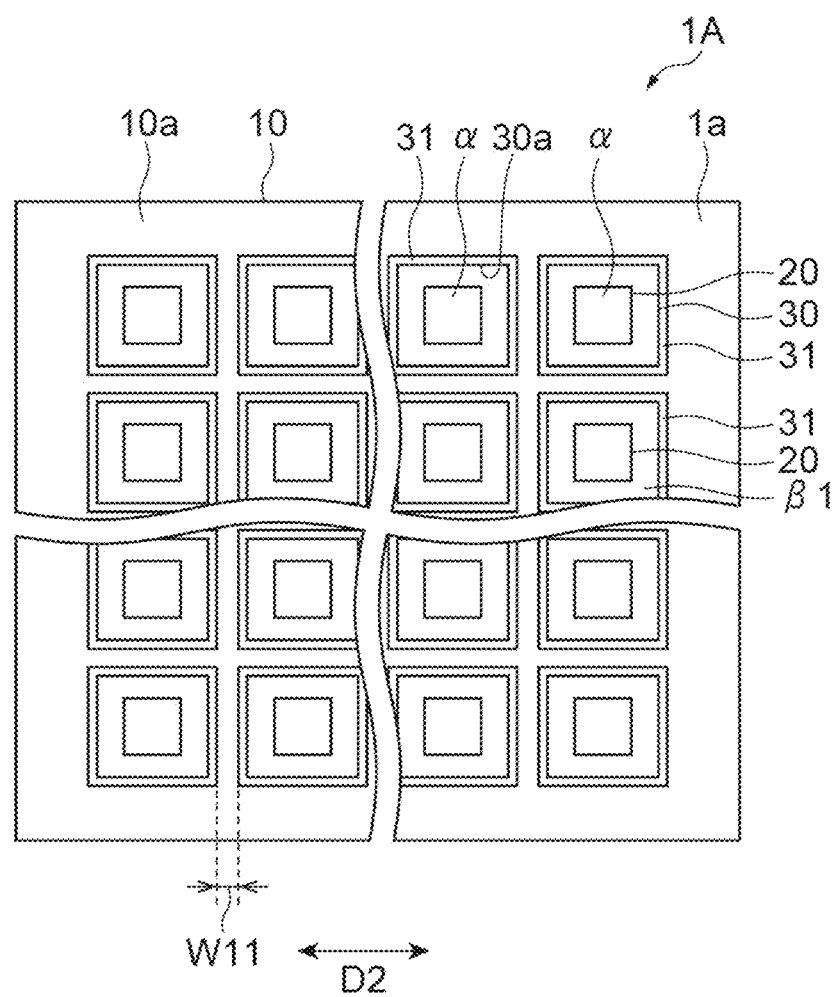
FIG. 8 is a schematic plan view illustrating an optical element in a modification example of the present embodiment.

Next, an optical element 1A in a modification example of the present embodiment will be described. The present modification example is generally similar to or the same as the embodiment described above. Hereinafter, the differences between the embodiment described above and the present modification example will be mainly described. Firstly, a configuration of the optical element 1A will be described with reference to FIG. 8. FIG. 8 is a schematic plan view illustrating an optical element in a modification example of the present embodiment. The optical element 1A of the present modification example is different from that in the embodiment described above in that a plurality of the optical regions α and the wall portions 30 are provided on the substrate 10.

As illustrated in FIG. 8, in the optical element 1A, the plurality of optical regions α separated from each other are provided on the main surface 10a of the substrate 10. The optical functional portion 20 is provided in each of the optical regions α. Therefore, in the optical element 1A, a plurality of the optical functional portions 20 are provided on the main surface 10a. In the present modification example, the plurality of optical regions α are two-dimensionally arranged on the main surface 10a. The plurality of optical regions α are disposed at equal intervals in each of a row direction and a column direction.

The wall portion 30 is provided on the periphery of each of the optical regions α as viewed in the direction D1. The wall portion 30 surrounds the optical functional portion 20 provided in each of the optical regions α. The wall portion 30 is disposed between the optical regions α adjacent to each other. The wall portion 30 defines a plurality of the internal regions β1 separated from each other. The plurality of optical regions α are respectively disposed in the internal regions β1 different from each other and defined by the wall portion 30. In other words, one optical region α is disposed in each of the internal regions β1. As a further modification example of the present modification example, the plurality of optical regions α separated from each other are disposed in each of the internal regions β1.

In the modification example illustrated in FIG. 8, the wall portion 30 includes a plurality of wall portions 31 separated from each other. A shortest distance W11 between the wall portions 30 adjacent to each other is the same as, for example, the shortest distance W4 between the wall portion 30 and the optical region α. In the present modification example, the shortest distance W11 is approximately 70 µm. The optical regions α adjacent to each other are respectively surrounded by the wall portions 31 separated from each other. As a further modification example of the present modification example, the optical regions α adjacent to each other may be respectively surrounded by the wall portions 30 connected to each other. In other words, the optical regions α adjacent to each other may be respectively surrounded by the wall portions 30 including a portion common to each other.

Figure 9:
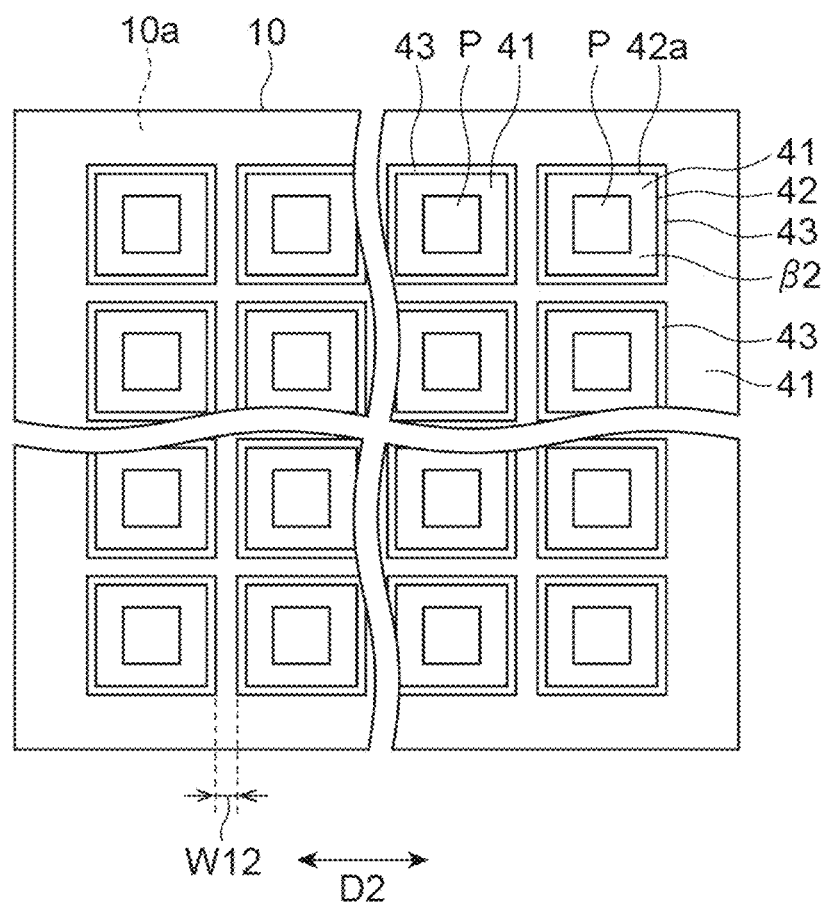
FIG. 9 is a view for describing a method for producing an optical element in the modification example of the present embodiment.

Next, a method for producing the optical element 1A described above will be described with reference to FIG. 9. FIG. 9 is a view for describing the method for producing an optical element in the modification example of the present embodiment. The optical element 1A of the present modification example is different from that in the embodiment described above in that in process S3 and process S4, a plurality of the pattern regions P are provided on the substrate 10.

In the method for producing the optical element 1A, as illustrated in FIG. 9, in process S3, the plurality of pattern regions P separated from each other are formed in the resist layer 41. For example, the plurality of pattern regions P are two-dimensionally arranged as viewed in the direction D1. For example, the plurality of pattern regions P are disposed at equal intervals in each of the row direction and the column direction. In this case, in process S4, the groove 42 is formed in a portion corresponding to the periphery of each of the pattern regions P as viewed in the direction D1. In other words, the groove 42 is formed to surround each of the pattern regions P. The groove 42 is disposed between the pattern regions P adjacent to each other. The groove 42 defines a plurality of the internal regions β2 separated from each other. The plurality of pattern regions P are respectively disposed in the internal regions β2 which are defined by the groove 42 and different from each other. In other words, one pattern region P is disposed in each of the internal regions β2.

As a further modification example of the present modification example, the plurality of pattern regions P separated from each other are disposed in each of the internal regions β2. The groove 42 may collectively surround the plurality of pattern regions P separated from each other. The groove 42 may be configured such that the wall portion 30 is not located between the optical regions α adjacent to each other.

In the modification example illustrated in FIG. 9, the groove 42 includes a plurality of grooves 43 separated from each other. A shortest distance W12 between the grooves 43 adjacent to each other is the same as, for example, the shortest distance W9 between the groove 42 and the pattern region P. In the present modification example, the shortest distance W12 is approximately 70 µm. The pattern regions P adjacent to each other are respectively surrounded by the grooves 43 separated from each other. As a further modification example of the present modification example, the pattern regions P adjacent to each other may be respectively surrounded by the grooves 42 connected to each other. In other words, the pattern regions P adjacent to each other may be respectively surrounded by the grooves 42 including a portion common to each other.

From the state illustrated in FIG. 9, in process S5, the dielectric layer 51 is formed to cover each of the pattern regions P and the groove 42. Thereafter, in process S6 and process S7, as in the modification example described with reference to FIG. 8, the plurality of optical regions α and the wall portions 30 separated from each other are formed on the main surface 10a of the substrate 10. The optical functional portion 20 is formed in each of the optical regions α. The optical functional portion 20 is formed at a position where each of the pattern regions P was disposed. As a result, the optical element 1A is formed.

Figure 10A:
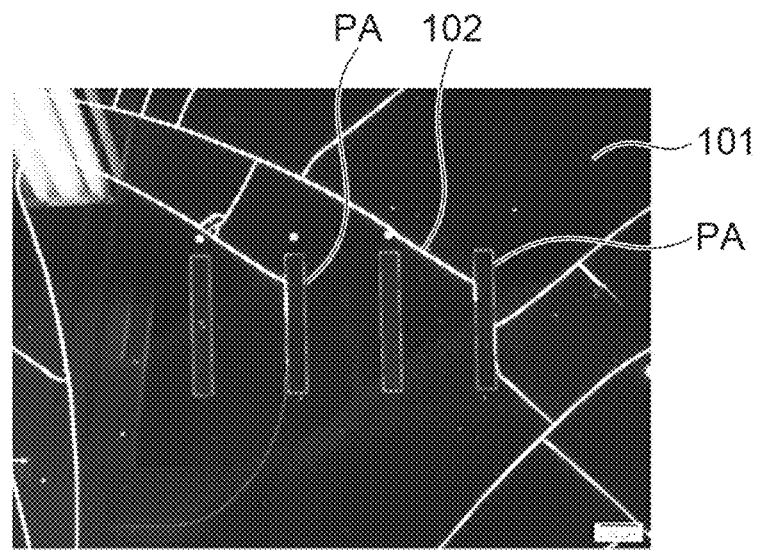
FIG. 10A is an image indicating a state where a resist layer is cracked.
Figure 10B:
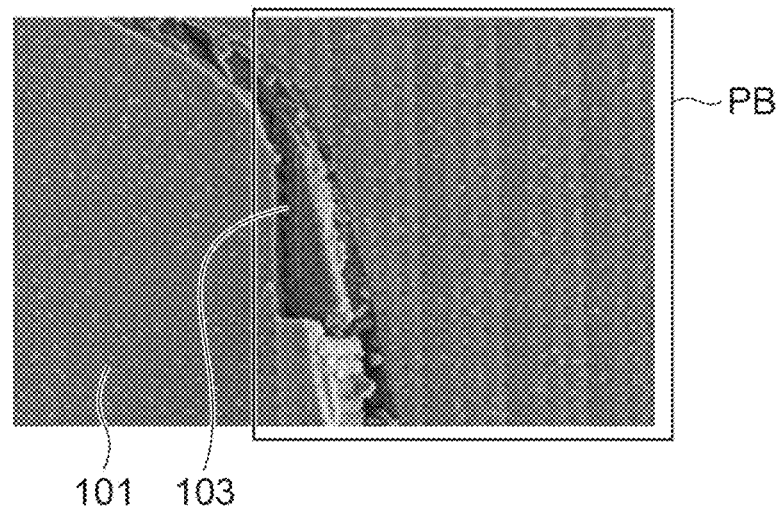
FIG. 10B is an image indicating a state where the resist layer is cracked.

Next, the effects of the methods for producing the optical elements 1 and 1A and the optical elements 1 and 1A described above will be described. When a dielectric is deposited as described in process S5, a resist layer is cracked as indicated in FIGS. 10A and 10B. FIGS. 10A and 10B indicate a state where a crack 102 is generated in a resist layer 101 when the dielectric is laminated to cover pattern regions PA and PB formed in the resist layer 101. The generated crack reaches the pattern regions PA and PB. FIG. 10B indicates a mode where the structure in the pattern region PB collapses due to the crack.

Figure 11:
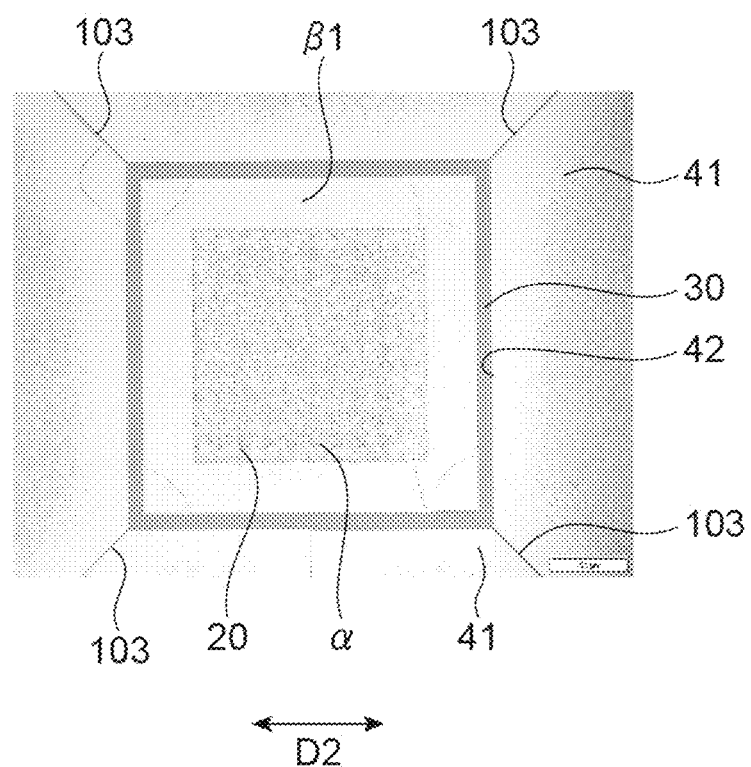
FIG. 11 is an image indicating a state where a crack is suppressed by a protective wall.

In the methods for producing the optical elements 1 and 1A, the groove 42 is formed in the portion corresponding to the periphery of the pattern region P. In this case, as indicated in FIG. 11, a crack is suppressed from being generated in the pattern region P when the dielectric 50 is deposited. In FIG. 11, a crack 103 generated outside the internal region β2 is stopped in the groove 42. If the generation of the crack 103 in the pattern region P is suppressed, by removal of the resist layer 41 after formation of the dielectric layer 51, the optical functional portion 20 having a desired structure can be realized. Since the generation of the crack 103 in the pattern region P is suppressed, the production yield of the optical elements 1 and 1A in each of which the optical functional portion 20 is provided can be improved, and the production throughput can also be improved.

In the methods for producing the optical elements 1 and 1A, when a microstructure such as the plurality of structural bodies 22 is formed in the optical functional portion 20, in process S3 and process S4, the resist layer 41 is processed by electron beam lithography. In this case, in process S3 and process S4, it takes a huge amount of time to completely remove a portion of the resist layer 41, which is unnecessary in forming the optical functional portion 20. According to the methods for producing the optical elements 1 and 1A in the present embodiment, the time of formation of the optical functional portion 20 having a desired structure can be reduced.

The methods for producing the optical elements 1 and 1A further include forming the dielectric layer 51 covering the groove 42 by deposition of the dielectric 50 in a state where the resist layer 41 is provided on the main surface 10a, and forming the wall portion 30 made of the dielectric 50. The resist layer 41 is removed after the dielectric layer 51 covering the groove 42 is formed, thereby the wall portion 30 is formed at a position where the groove 42 was disposed on the main surface 10a. In this case, a crack from outside the internal region β2 is suppressed from reaching the pattern region P.

In the methods for producing the optical elements 1 and 1A, the groove 42 is formed in the resist layer 41 to completely surround the pattern region P as viewed in the direction D1. In this case, the generation of a crack in the pattern region P is more reliably suppressed.

In the methods for producing the optical elements 1 and 1A, the groove 42 is formed to surround the pattern region P as viewed in the direction D1, so that the internal region β2 including the pattern region P is defined. As viewed in the direction D1, the area of a portion obtained by removing the pattern region P from the internal region β2 is smaller than the area of a portion obtained by removing the internal region β2 from a portion in which the resist layer 41 is provided. In this case, the generation of a crack in the pattern region P is more reliably suppressed.

In the method for producing the optical element 1A, the plurality of pattern regions P separated from each other are formed in the resist layer 41. The groove 42 is formed in the portion corresponding to the periphery of each of the pattern regions P as viewed in the direction D1. The dielectric layer 51 is formed to cover each of the pattern regions P. The optical functional portion 20 is formed at the position where each of the pattern regions P was disposed. In this case, the plurality of optical functional portions 20 are formed at once, and further the generation of a crack in each of the pattern regions P is suppressed.

In the optical elements 1 and 1A, the wall portion 30 is provided on the periphery of the optical functional portion 20. With the configuration where the wall portion 30 is formed on the periphery of the optical functional portion 20 in such a manner, the optical functional portion 20 having a desired structure can be easily realized. In this case, the production yield of the optical elements 1 and 1A in each of which the optical functional portion 20 is provided can be improved, and the production throughput can also be improved. For example, in the configuration where the wall portion 30 is formed on the periphery of the optical functional portion 20, when the dielectric forming the wall portion 30 is deposited, the portion forming the pattern region P corresponding to the optical functional portion 20 is divided from the other portion of the resist layer 41. For this reason, a crack is unlikely to be generated in the pattern region P.

In the optical elements 1 and 1A, the wall portion 30 completely surrounds the optical functional portion 20 as viewed in the direction D1. In this case, the optical functional portion 20 having a desired structure can be realized more easily and reliably.

In the optical elements 1 and 1A, the wall portion 30 defines the internal region β1 including the optical region α as viewed in the direction D1. As viewed in the direction D1, the area of a portion obtained by removing the optical region α from the internal region β1 is smaller than the area of a portion obtained by removing the internal region β1 from the main surface 10a. In this case, the optical functional portion 20 having a desired structure can be more reliably realized.

In the optical element 1A, on the main surface 10a of the substrate 10, the optical functional portions 20 are respectively provided in the optical regions α separated from each other on the main surface 10a of the substrate 10. The wall portion 30 is provided on the periphery of each of the optical regions α as viewed in the direction D1. In this case, the optical element 1A provided with the plurality of optical functional portions 20 having a desired structure can be easily realized.

The embodiment and the modification examples of the present invention have been described above; however, the present invention is not necessarily limited to the embodiment and the modification examples described above, and various changes can be made without departing from the concept of the present invention.

For example, as viewed in the direction D1, the shapes of the optical region α and the pattern region P are not limited to a rectangular shape. For example, as viewed in the direction D1, the shapes of the optical region α and the pattern region P may be a circular shape. The shapes of the wall portion 30 and the groove 42 are not limited to a rectangular ring shape. For example, the shapes of the optical region α and the pattern region P may be a circular ring shape. When the shapes of the optical region α and the pattern region P are a rectangular shape, the formation thereof is easy, and the optical functional portion 20 having a desired structure can be easily realized. When the wall portion 30 and the groove 42 are formed along the edges of the optical region α and the pattern region P, a crack in the pattern region P is unlikely to be generated.

What is claimed is:

1. A method for producing an optical element, the method comprising:
    forming a resist layer on a main surface of a substrate;
    forming in the resist layer a pattern region where a pattern penetrating through the resist layer is provided;
    forming a groove in a portion corresponding to a periphery of the pattern region as viewed in a direction orthogonal to the main surface;
    depositing a dielectric in a state where the resist layer processed by forming the pattern region and the groove is provided on the main surface, to form a dielectric layer covering the pattern region; and
    removing the resist layer after the dielectric layer covering the pattern region is formed, to form an optical functional portion at a position where the pattern region was disposed on the main surface, the optical functional portion being made of the dielectric,
    wherein the groove formed in the resist layer suppresses cracks from being generated in the pattern region when depositing the dielectric layer.

2. The method for producing an optical element according to claim 1, further comprising:
    depositing the dielectric in a state where the resist layer is provided on the main surface, to form a dielectric layer covering the groove; and
    removing the resist layer after the dielectric layer covering the groove is formed, to form a wall portion at a position where the groove was disposed on the main surface, the wall portion being made of the dielectric.

3. The method for producing an optical element according to claim 1,
    wherein the groove is formed in the resist layer to completely surround the pattern region as viewed in the direction orthogonal to the main surface.

4. The method for producing an optical element according to claim 1,
    wherein the groove is formed to surround the pattern region as viewed in the direction orthogonal to the main surface, so that an internal region including the pattern region is defined, and
    as viewed in the direction orthogonal to the main surface, an area of a portion obtained by removing the pattern region from the internal region is smaller than an area of a portion obtained by removing the internal region from a portion in which the resist layer is provided.

5. The method for producing an optical element according to claim 1,
    wherein the optical functional portion includes a plurality of structural bodies, and
    each of the structural bodies is formed such that a maximum length of each of the structural bodies in a direction along the main surface is 200 nm or less.

6. The method for producing an optical element according to claim 1,
    wherein a plurality of the pattern regions separated from each other are formed in the resist layer,
    the groove is formed in a portion corresponding to the periphery of each of the pattern regions as viewed in the direction orthogonal to the main surface,
    the dielectric layer is formed to cover each of the pattern regions, and
    the optical functional portion is formed at a position where each of the pattern regions was disposed.

7. A method for producing an optical element, the method comprising:
    forming a resist layer on a main surface of a substrate;
    forming in the resist layer a pattern region where a pattern penetrating through the resist layer is provided;
    forming a groove in a portion corresponding to a periphery of the pattern region as viewed in a direction orthogonal to the main surface, the groove suppressing cracks from being generated in the pattern regions;
    depositing a dielectric in a state where the resist layer processed by forming the pattern region and the groove is provided on the main surface, to form a dielectric layer covering the pattern region;
    removing the resist layer after the dielectric layer covering the pattern region is formed, to form an optical functional portion at a position where the pattern region was disposed on the main surface, the optical functional portion being made of the dielectric;
    depositing the dielectric in a state where the resist layer is provided on the main surface, to form a dielectric layer covering the groove; and
    removing the resist layer after the dielectric layer covering the groove is formed, to form a wall portion at a position where the groove was disposed on the main surface, the wall portion being made of the dielectric.

8. The method for producing an optical element according to claim 7,
    wherein the groove is formed in the resist layer to completely surround the pattern region as viewed in the direction orthogonal to the main surface.

9. The method for producing an optical element according to claim 7,
    wherein the groove is formed to surround the pattern region as viewed in the direction orthogonal to the main surface, so that an internal region including the pattern region is defined, and
    as viewed in the direction orthogonal to the main surface, an area of a portion obtained by removing the pattern region from the internal region is smaller than an area of a portion obtained by removing the internal region from a portion in which the resist layer is provided.

10. The method for producing an optical element according to claim 7,
    wherein the optical functional portion includes a plurality of structural bodies, and each of the structural bodies is formed such that a maximum length of each of the structural bodies in a direction along the main surface is 200 nm or less.

11. The method for producing an optical element according to claim 7,
wherein a plurality of the pattern regions separated from each other are formed in the resist layer,
the groove is formed in a portion corresponding to the periphery of each of the pattern regions as viewed in the direction orthogonal to the main surface,
the dielectric layer is formed to cover each of the pattern regions, and
the optical functional portion is formed at a position where each of the pattern regions was disposed.

* * * * *